(12) United States Patent
Benzer

(10) Patent No.: US 8,400,206 B2
(45) Date of Patent: Mar. 19, 2013

(54) LOW VOLTAGE INPUT LEVEL SHIFTER CIRCUIT AND METHOD FOR UTILIZING SAME

(75) Inventor: Darrin Benzer, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/590,761

(22) Filed: Nov. 12, 2009

(65) Prior Publication Data

US 2011/0109369 A1    May 12, 2011

(51) Int. Cl.
*H03L 5/00*       (2006.01)
(52) U.S. Cl. .............................. 327/333; 326/62; 326/81
(58) Field of Classification Search .............. 326/62–63, 326/80–81; 327/306, 333
See application file for complete search history.

(56) References Cited

U.S. PATENT DOCUMENTS

| | | | | |
|---|---|---|---|---|
| 6,437,627 | B1 * | 8/2002 | Tran et al. ...................... | 327/333 |
| 7,239,191 | B2 * | 7/2007 | Lee ................................ | 327/333 |
| 7,414,435 | B2 * | 8/2008 | Kuzmenka et al. ............. | 326/81 |
| 7,710,183 | B2 * | 5/2010 | Chaba et al. .................... | 326/81 |
| 7,902,870 | B1 * | 3/2011 | Jiang .............................. | 326/68 |
| 2009/0027104 | A1 * | 1/2009 | Foley et al. .................... | 327/333 |

* cited by examiner

*Primary Examiner* — Dinh T. Le
(74) *Attorney, Agent, or Firm* — Farjami & Farjami LLP

(57) ABSTRACT

According to one embodiment, a level shifter circuit operable with a low voltage input comprises first and second pull-down switches configured to receive the low voltage input as respective non-inverted and inverted control voltages, first and second pull-up switches coupled between the respective first and second pull-down switches and an output supply voltage, and a pull-up boost switching stage coupled to a node between the first pull-up switch and the first pull-down switch. The pull-up boost switching stage is configured to turn ON in response to the second pull-down switch turning ON, and to turn OFF before the first pull-up switch turns OFF. In one embodiment, the level shifter circuit may be implemented as part of an input/output (IO) pad of an integrated circuit (IC) fabricated on a semiconductor die.

18 Claims, 3 Drawing Sheets

LOW VOLTAGE INPUT LEVEL SHIFTER CIRCUIT AND METHOD FOR UTILIZING SAME

BACKGROUND OF THE INVENTION

1. Field of the Invention

The present invention is generally in the field of electrical circuits and systems. More specifically, the present invention is in the field of voltage level shifting in electrical circuits and systems.

2. Background Art

Level shifter circuits are widely used in a variety of modern electronic devices and systems. Many integrated circuit (IC) applications, for example, require translation of one or more signals from one voltage level to another, and thus employ level shifter circuits to translate, or shift, a lower voltage input signal to a higher voltage output, or vice versa. For instance, input/output (IO) pads utilized in an IC may rely on a level shifter circuit to translate a low voltage core signal to a higher voltage level suitable for external signaling.

Level shifting circuits have traditionally been implemented using transistors configured to pull-up and pull-down various circuit nodes in order to perform the voltage translation. For example, in a level shifter circuit configured to translate a lower voltage input to a higher voltage output, the lower input voltage is typically used to drive the pull-down transistors, which must overdrive the pull-up transistors at some stages of the level shifting process. However, as advances in technology result in ever lower core voltage signals, the input signals driving the pull-down transistors may now approach the threshold voltages of those devices. As a result, those pull-down devices may be lightly driven and thus encounter difficulty in overdriving their companion pull-up devices, as is necessary for successful operation of the circuit.

One conventional approach to solving the aforementioned problem is to greatly reduce the size of the pull-up transistors relative to the pull-down devices with which they are paired. For example, it is not uncommon for a pull-up device to be ten or more times smaller than its pull-down paired device. Although the conventional solution can enhance the ability of the pull-down device to overdrive its pull-up companion, that approach typically results in substantial duty cycle distortion because of the relative weakness of the pull-up devices. However, many modern electronic systems require tighter control over duty cycle symmetry than can be achieved using the conventional approach, resulting in degraded performance of those systems when used in conjunction with conventional level shifter circuit receiving low voltage inputs.

Thus, there is a need to overcome the drawbacks and deficiencies in the art by providing a low voltage input level shifter circuit configured to reduce or eliminate duty cycle distortion.

SUMMARY OF THE INVENTION

A low voltage input level shifter circuit and method for utilizing same, substantially as shown in and/or described in connection with at least one of the figures, as set forth more completely in the claims.

DETAILED DESCRIPTION OF THE INVENTION

Figure 1:
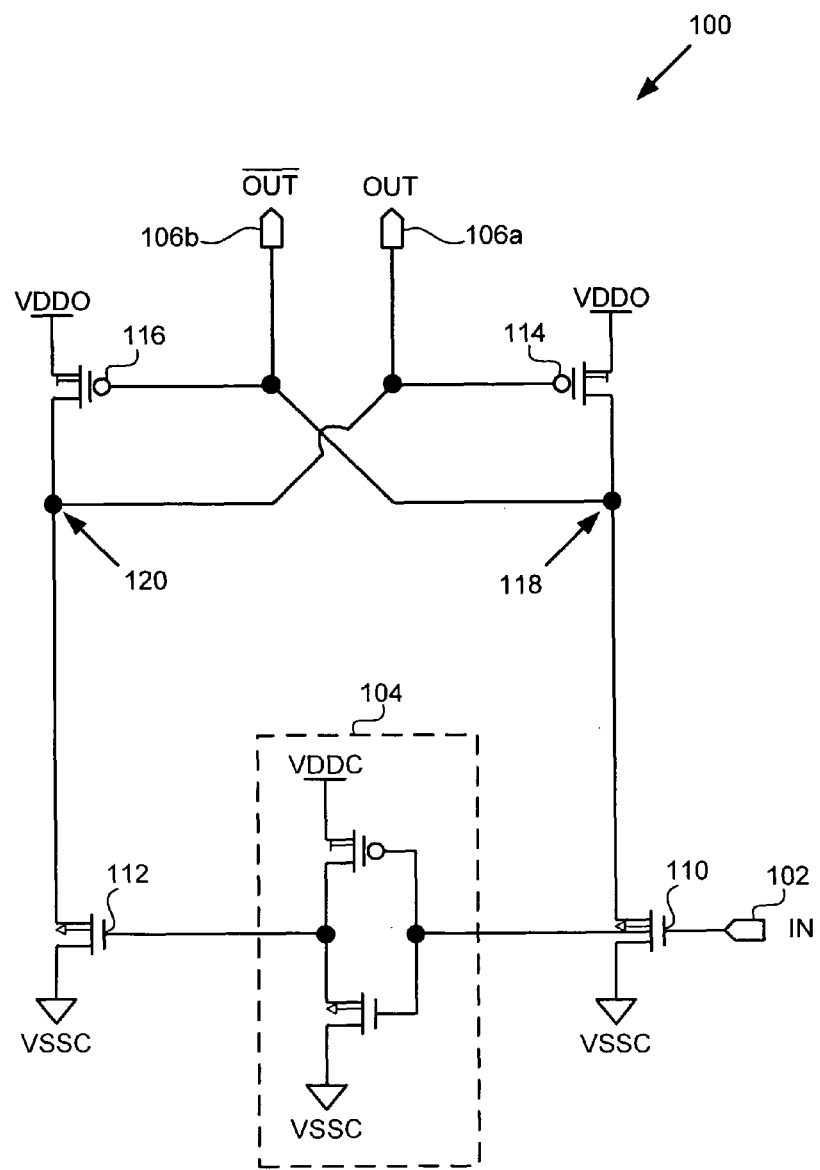
FIG. 1 is a diagram showing a conventional level shifter circuit.

The present invention is directed to a low voltage input level shifter circuit and method for its use. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 is a diagram showing a conventional level shifter circuit. Conventional level shifter circuit 100 is provided for the purpose of translating a lower voltage at input 102, e.g., a voltage relative to input supply voltage VDDC, to a higher voltage output, at respective outputs 106a and 106b, e.g., output voltages relative to output supply voltage VDDO. As shown in FIG. 1, conventional level shifter circuit 100 includes first and second pull-down transistors 110 and 112, shown as NMOS devices, first and second pull-up transistors 114 and 116, shown as PMOS devices, and inverter 104 for inverting input 102 prior to its receipt by the gate of second pull-down transistor 112. Also shown in FIG. 1 are nodes 118 and 120, situated respectively between first pull-up transistor 114 and first pull-down transistor 110, and between second pull-up transistor 116 and second pull-down transistor 112.

In operation, conventional level shifter circuit 100 performs as follows: If input 102 is initially LOW, first pull-down transistor 110 is initially OFF and second pull-down transistor 112 is ON. As a result, node 120 is pulled LOW by second pull-down transistor 112, and output 106a is correspondingly LOW. A LOW at node 120 and output 106a causes first pull-up transistor 114 to turn ON, which, in turn pulls node 118 HIGH, resulting in a HIGH at output 106b.

When input 102 subsequently transitions from LOW to HIGH, first pull-down transistor 110 turns ON and second pull-down transistor 112 turns OFF. However, when first pull-down transistor 110 turns ON, first pull-up transistor 114 is also ON as a result of its previous state. Consequently, in order for conventional level shifter circuit 100 to operate, first pull-down transistor 110 must be strong enough to overdrive first pull-up transistor 114, to pull node 118 LOW. By pulling node 118 LOW, first pull-down transistor 110 turns second pull-up transistor 116 ON, sending output 106a HIGH and turning first pull-up transistor 114 OFF. Similarly, a voltage transition from HIGH to LOW at input 102 requires that second pull-down transistor 112 be strong enough to overdrive second pull-up transistor 116 to pull node 120 and output 106a LOW, resulting in first pull-up transistor 114 turning ON and second pull-up transistor 116 turning OFF.

Problems arise, however, because the input voltage supplied at input 102 may only slightly exceed the threshold voltages of first and second pull-down transistors 110 and 112. As shown in FIG. 1, first and second pull-down transistors 110 and 112 must be selected to withstand a drain-to-source voltage equal to VDDO, which may be approximately 2.2 V or 3.3 V, for example. As a result, both first and second pull-down transistors 110 and 112 can be expected to have higher threshold voltages than lower voltage transistors. Nevertheless, conventional level shifter circuit 100 requires that first and second pull-down transistors 110 and 112 receive their drive signals from input 102, which may correspond to a voltage input of approximately 1.0 V, or less. Consequently neither of first and second pull-down transistors 110 and 112 is typically driven hard when turned ON in response to input 102.

Despite being lightly driven when turned ON, each of first and second pull-down transistors 110 and 112 must be able to initially overdrive respective first and second pull-up transistors 114 and 116. In order to ensure that condition, first and second pull-up transistors 114 and 116 are selected to be much smaller, and thus weaker, than respective first and second pull-down transistors 110 and 112. However, that relative weakness of first and second pull-up transistors 114 and 116 results in a correspondingly sluggish pull-up response by conventional level shifter circuit 100 configured to accommodate a low voltage at input 102. Consequently, the rising edge of output 106a, for example, can be expected to display a significantly more gradual slope than its falling edge, resulting in undesirable distortion of the output duty cycle.

Figure 2:
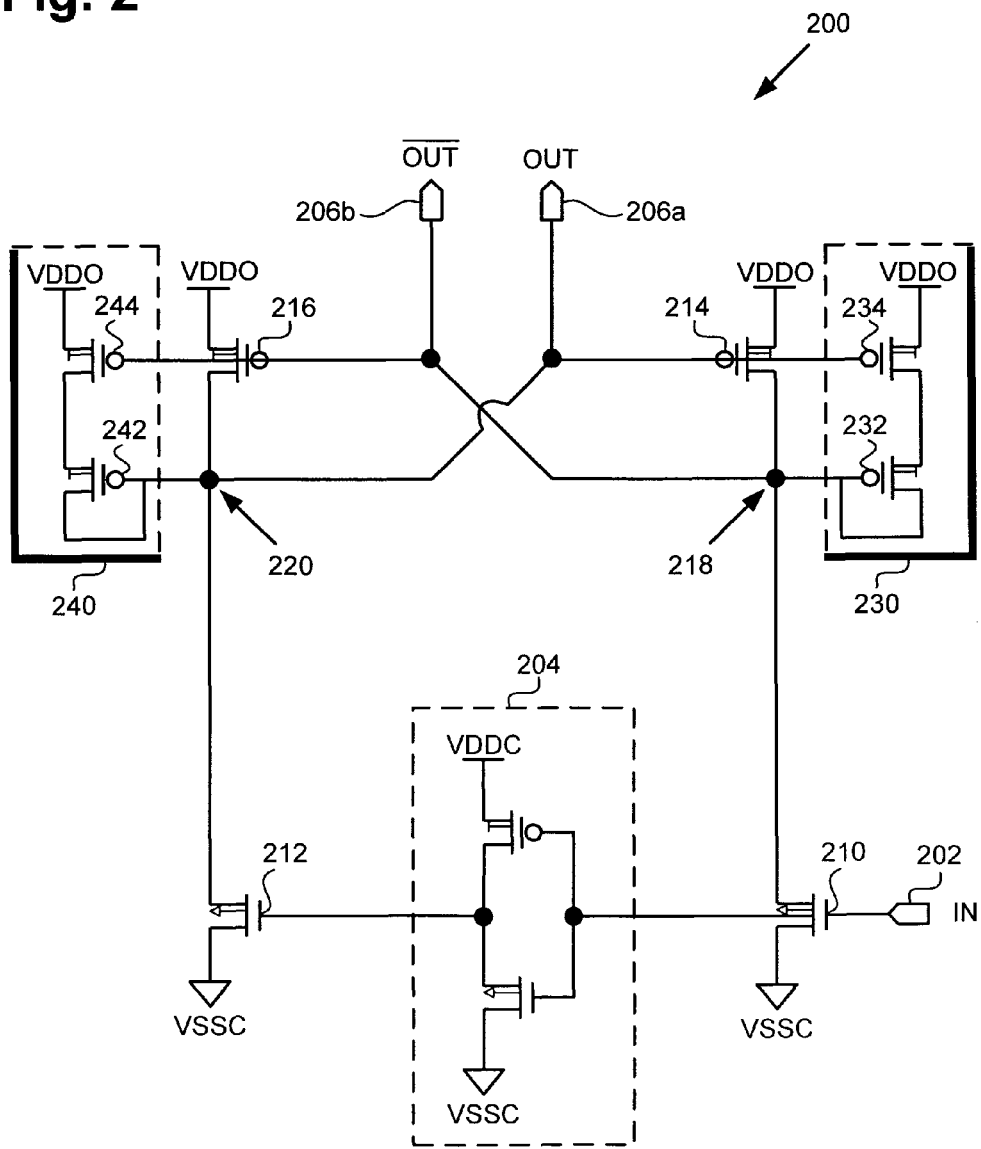
FIG. 2 is a diagram showing a low voltage input level shifter circuit, according to one embodiment of the present invention.

Turning to FIG. 2, FIG. 2 is a diagram showing a low voltage input level shifter circuit, according to one embodiment of the present invention, that succeeds in overcoming the drawbacks and deficiencies of the conventional implementation shown in FIG. 1. Low voltage input level shifter circuit 200, in FIG. 2, is configured to translate a low voltage at input 202, such as a 0.9 V or 1.0 V input supply voltage VDDC, to a higher voltage output, such as a 2.2 V or 3.3 V output supply voltage VDDO, for example, at respective outputs 206a and 206b. Low voltage input level shifter circuit 200 may be advantageously implemented as part of an input/output (IO) pad of an integrated circuit (IC) fabricated on a semiconductor die, for example, to translate a low voltage core signal to a voltage level suitable for use in controlling logic formed on the IC.

As shown in FIG. 2, low voltage input level shifter circuit 200 comprises first and second pull-down switches 210 and 212, represented as NMOS transistors in the present embodiment, and configured to receive low voltage input 202 as respective non-inverted and inverted control voltages. Low voltage input level shifter circuit 200 also comprises first and second pull-up switches 214 and 216, represented as PMOS transistors, coupled between respective first and second pull-down switches 210 and 212, and output supply voltage VDDO of circuit 200. FIG. 2 further shows nodes 218 and 220 situated respectively between first pull-up switch 214 and first pull-down switch 210, and between second pull-up switch 216 and second pull-down switch 212, as well as inverter 204. In addition, low voltage input level shifter circuit 200 comprises first and second pull-up boost switching stages 230 and 240, having no analogues in the conventional art.

As will be explained in greater detail below, first and second pull-up boost switching stages 230 and 240 are respectively coupled to nodes 218 and 220. First and second pull-up boost switching stages 230 and 240, which may each be implemented using a plurality of transistors, such as respective PMOS transistor pairs 232 and 234, and 242 and 244, for example, are configured to turn ON and OFF in a particular relationship with other devices of low voltage input level shifter circuit 200. For example, first pull-up boost switching stage 230 is configured to turn ON in response to second pull-down switch 212 turning ON, and to turn OFF before first pull-up switch 214 turns OFF. Analogously, second pull-up boost switching stage 240 is configured to turn ON in response to first pull-down switch 210 turning ON, and to turn OFF before second pull-up switch 216 turns OFF.

Figure 3:
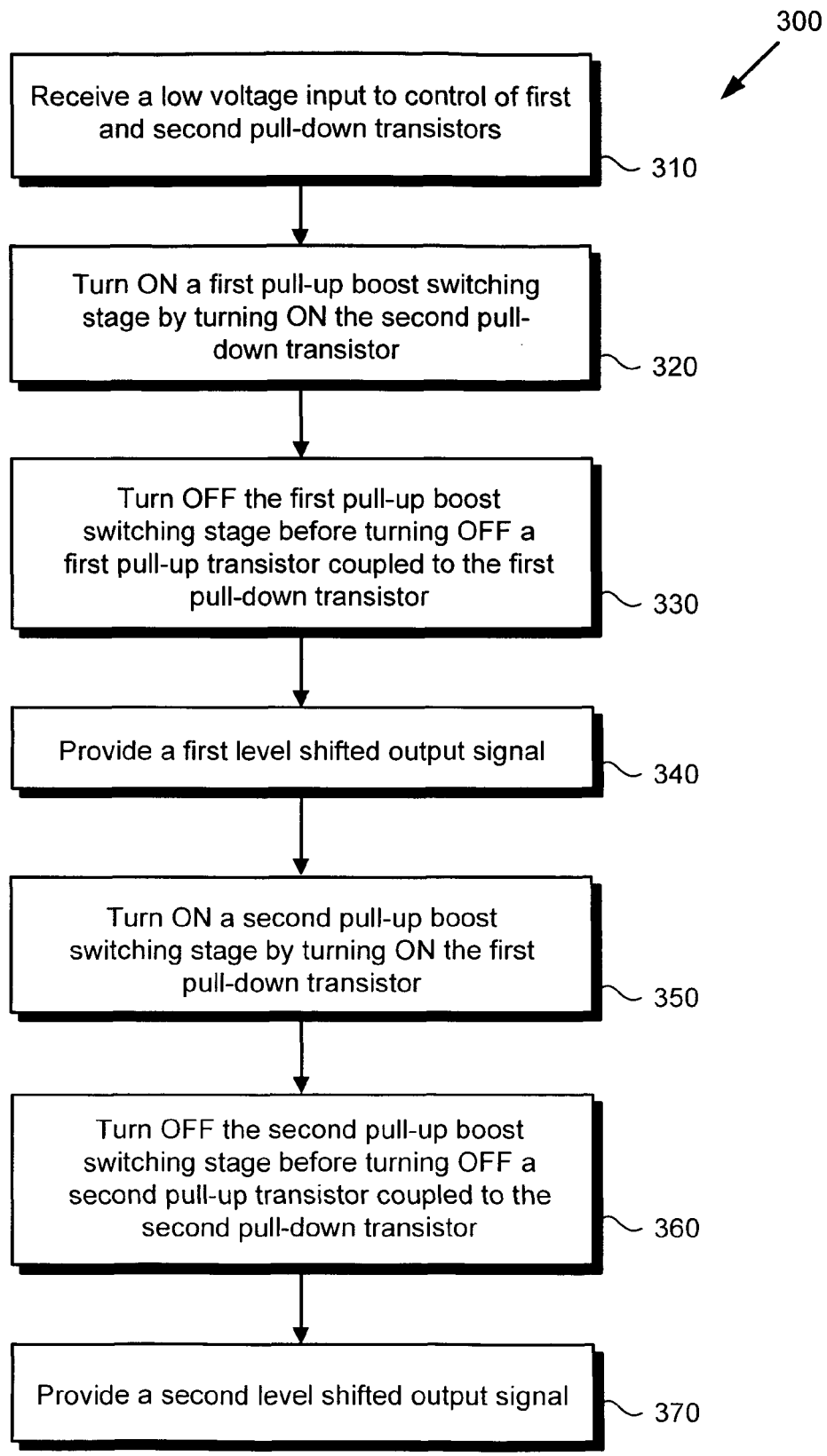
FIG. 3 is a flowchart presenting a method for level shifting a low voltage input, according to one embodiment of the present invention.

Some of the benefits and advantages accruing from low voltage input level shifter circuit 200 will be further described in combination with flowchart 300, in FIG. 3, which presents an example embodiment of a method for level shifting a low voltage input. Certain details and features have been left out of flowchart 300 that are apparent to a person of ordinary skill in the art. For example, a step may comprise one or more substeps or may involve specialized equipment or materials, as known in the art. While steps 310 through 370 indicated in flowchart 300 are sufficient to describe one embodiment of the present invention, other embodiments of the present invention may utilize steps different from those shown in flowchart 300, or may comprise more, or fewer, steps.

It is noted that the circuit devices represented in FIG. 2 are provided as specific implementations of the present inventive principles, and are shown with such specificity for the purposes of conceptual clarity. It should further be understood that particular details such as the number of switching devices included in first and second pull-up boost switching stages 230 and 240, the types of semiconductor devices represented in FIG. 2, and their arrangement, are being provided as examples, and should not be interpreted as limitations.

For example, although the embodiment shown in FIG. 2 includes two pull-up boost switching stages comprising substantially matching devices, in other embodiments, other arrangements are possible. In one embodiment, for example, the number and/or sizes of the switching devices implemented in pull-up boost switching stage 230 may be different from the number and/or sizes of the switching devices present in pull-up boost switching stage 240. In another embodiment, one of pull-up boost switching stages 230 and 240 may be absent entirely, in which instance low voltage input level shifter circuit 200 could comprise a single pull-up boost switching stage.

Continuing with step 310 in FIG. 3 and low voltage input level shifter circuit 200, in FIG. 2, step 310 of flowchart 300 comprises receiving low voltage input 202 to gates of first and second pull-down transistors 210 and 212. As shown in FIG. 2, input 202 will be received as a non-inverted input at the gate of first pull-down transistor 210, and as an inverted input, e.g., due to inverter 204, at the gate of second pull-down transistor 212. When input 202 is HIGH, first pull-down transistor 210 is ON and second pull-down transistor 212 is OFF. As a result, node 218 is pulled LOW by first pull-down transistor 210, and output 206b is correspondingly LOW. A LOW at node 218 and output 206b causes output 206a to be HIGH. Consequently, under the described conditions, the gate of PMOS transistor 232 is set LOW but the gates of first pull-up transistor 214 and PMOS transistor 234 are set HIGH, causing both of first pull-up transistor 214 and first pull-up boost switching stage 230 to be effectively OFF when second pull-down transistor 212 is OFF.

Moving on to step 320 in FIG. 3 and continuing to refer to low voltage input level shifter circuit 200, in FIG. 2, step 320 of flowchart 300 comprises turning ON first pull-up boost switching stage 230 by turning ON second pull-down transistor 212. As shown in FIG. 2, when input 202 transitions from HIGH to LOW, the inverted input provided to the gate of second pull-down transistor 212 causes that device to turn ON. When second pull-down transistor 212 turns ON, it overdrives second pull-up transistor 216 and pulls node 220 LOW, which causes the gates of first-pull up transistor 214 and PMOS transistor 234 of first pull-up boost switching stage 230 to go LOW. Because the gate of PMOS transistor 232 was already low, due to its previous state, turning ON second pull-down transistor 212 causes first pull-up transistor 214 and first pull-up boost switching stage 230 to be turned ON.

As previously described, in order for a level shifter circuit receiving a low voltage input to operate, first and second pull-down transistors 210 and 212 must be powerful enough to overdrive respective first and second pull-up transistors 214 and 216, even when lightly driven by low voltage input 202. In order to ensure that condition, first and second pull-up transistors 214 and 216 are typically selected to be much smaller, e.g., more than ten times smaller, and thus weaker than respective first and second pull-down transistors 210 and 212.

The relative weakness of first and second pull-up transistors 214 and 216 can result in a correspondingly sluggish pull-up response if those devices are unassisted in performing their respective pull-up operations. However, according to the present inventive concepts, a pull-up boost switching stage, which may comprise a plurality of switching devices that are larger and more powerful than an existing pull-up switch, e.g., PMOS transistor 232 and/or 234 larger and more powerful than first pull-up transistor 214, is provided to boost the pull-up performance of low input level shifter circuit 200. Moreover, configuring the pull-up boost switching stage to turn ON along with its companion pull-up device and to turn OFF before the companion pull-up device turns OFF, results in reduction or elimination of the output duty cycle distortion plaguing conventional low voltage input level shifter circuits, without interfering with the desirable operating characteristics of those circuits.

Referring now to step 330 of flowchart 300, step 330 comprises turning OFF first pull-up boost switching stage 230 before turning OFF first pull-up transistor 214. Step 330 occurs quite naturally within the embodiment of low voltage input level shifter circuit 200. For example, as shown in FIG. 2, turning ON first pull-up transistor 214 and first pull-up boost switching stage 230 causes node 218 and output 206b to be pulled HIGH. However, when node 218 rises to within a threshold voltage of PMOS 232, that device is turned OFF, effectively causing pull-up boost switching stage 230 to turn OFF as well.

Continuing with step 340 of flowchart 300, step 340 comprises providing level shifted output 206b. As may be seen from FIG. 2, turning OFF pull-up boost switching stage 230, in step 330, by turning OFF PMOS transistor 232, has no immediate impact on the state of first pull-up transistor 214, which continues to pull node 218 and output 206b HIGH, providing level shifted output 206b referenced to VDDO from low voltage input 202 referenced to VDDC. In fact, first pull-up transistor 214 will remain ON until input 202 goes HIGH, by which juncture first pull-up boost switching stage 230 has already been turned OFF.

Moving on to steps 350 through 370 of FIG. 3, steps 350 through 370 of flowchart 300 correspond to a boosted pull-up operation by second pull-up boost switching stage 240, similar to that performed by first pull-up boost switching stage 230 in steps 320 through 340 of flowchart 300. That is to say, a transition of input 202 from LOW to HIGH turns ON first pull-down transistor 210. Because first pull-up boost switching stage 230 has already turned OFF by then, first-pull down transistor 210 must overdrive first-pull up transistor 214 alone, which it is configured to do. Pulling node 218 LOW by first pull-down transistor 210 causes the gates of second pull-up transistor 216 and PMOS 244 to go LOW, turning those devices ON. Because the gate of PMOS 242 was already LOW due to the previous state of circuit 200, turning ON first pull-down transistor 210 causes second pull-up boost switching stage 240 to turn ON, in step 350.

When node 220 and output 206a are pulled up to within a threshold voltage of PMOS 242, that device will turn OFF, causing second pull-up boost switching stage 240 to turn OFF, in step 360, before second pull-up transistor 216 turns OFF. Second pull-up transistor 216 continues to pull output 206a HIGH, providing level shifted output 206a in step 370.

As may be appreciated from the foregoing discussion, as well as from examination of the embodiment shown by FIG. 2, the present inventive concepts enable tuning of the output duty cycle through appropriate selection of first and second pull-up boost switching stages 230 and 240. For example, use of suitably selected and substantially matching devices in each of first and second pull-up boost switching stages 230 and 240 can produce a substantially steep and symmetrical duty cycle, thereby advantageously improving the speed and performance of a system driven by the output of low voltage input level shifter circuit 200. Alternatively, in some implementations, it may be deemed advantageous to purposefully impose a selective asymmetry on the output duty cycle. Corresponding embodiments of low voltage input level shifter circuit 200 may thus result in first and second pull-up boost switching stages 230 and 240 providing a differential boost, enabling tuning of the output duty cycle. In one embodiment, it may be advantageous to boost one pull-up operation of low voltage input level shifter circuit 200, but not the other, resulting perhaps in omission of one or the other of first and second pull-up boost switching stages 230 and 240.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A level shifter circuit operable with a low voltage input, said level shifter circuit comprising:
   first and second pull-down switches configured to receive said low voltage input as respective non-inverted and inverted control voltages;
   first and second pull-up switches coupled between respective said first and second pull-down switches and an output supply voltage of said level shifter circuit;
   an inverter coupled to said second pull-down switch; and
   a pull-up boost switching stage coupled to a node between said first pull-up switch and said first pull-down switch, said pull-up boost switching stage configured to turn ON in response to said second pull-down switch turning ON, and to turn OFF before said first pull-up switch turns OFF, said pull-up boost switching stage further configured to turn ON along with said first pull-up switch, said pull-up boost switching stage comprising a transistor having a drain and a gate tied to said node.

2. The level shifter circuit of claim 1, wherein said low voltage input is less than or substantially equal to approximately 1.0 V.

3. The level shifter circuit of claim 1, wherein each of said first and second pull-down switches and said first and second pull-up switches comprise transistors.

4. The level shifter circuit of claim 1, wherein each of said first and second pull-down switches comprises at least one NMOS device.

5. The level shifter circuit of claim 1, wherein each of said first and second pull-up switches comprises at least one PMOS device.

6. The level shifter circuit of claim 1, wherein said pull-up boost switching stage comprises a plurality of transistors.

7. The level shifter circuit of claim 6, wherein said pull-up boost switching stage turns OFF when one of said plurality of transistors turns OFF.

8. The level shifter circuit of claim 1, wherein said pull-up boost switching stage comprises a plurality of PMOS devices.

9. The level shifter circuit of claim 1, further comprising a second pull-up boost switching stage coupled to a node between said second pull-up switch and said second pull-down switch, said second pull-up boost switching stage configured to turn ON in response to said first pull-down switch turning ON, and to turn OFF before said second pull-up switch turns OFF.

10. An integrated circuit (IC) fabricated on a semiconductor die, said integrated circuit including an input-output (IO) pad containing at least one level shifter circuit operable with a low voltage input, said level shifter circuit comprising:
    first and second pull-down switches configured to receive said low voltage input as respective non-inverted and inverted control voltages;
    first and second pull-up switches coupled between respective said first and second pull-down switches and a output supply voltage of said level shifter circuit;
    an inverter coupled to said second pull-down switch; and
    a pull-up boost switching stage coupled to a node between said first pull-up switch and said first pull-down switch, said pull-up boost switching stage configured to turn ON in response to said second pull-down switch turning ON, and to turn OFF before said first pull-up switch turns OFF, said pull-up boost switching stage further configured to turn ON along with said first pull-up switch, said pull-up boost switching stage comprising a transistor having a drain and a gate tied to said node.

11. The integrated circuit of claim 10, wherein said low voltage input to said level shifter circuit is less than or substantially equal to approximately 1.0 V.

12. The integrated circuit of claim 10, wherein said low voltage input to said level shifter circuit further comprises a second pull-up boost switching stage coupled to a node between said second pull-up switch and said second pull-down switch, said second pull-up boost switching stage configured to turn ON in response to said first pull-down switch turning ON, and to turn OFF before said second pull-up switch turns OFF.

13. A method for execution by a level shifter circuit operable with a low voltage input, said method comprising:
    receiving said low voltage input as non-inverted and inverted control voltages by respective first and second pull-down switches of said level shifter circuit, said second pull-down switch receiving said inverted control voltage through an inverter coupled to said second pull-down switch;
    turning ON a pull-up boost switching stage coupled to a node between said first pull-down switch and a first pull-up switch by turning ON said second pull-down switch, said pull-up boost switching stage turning ON along with said first pull-up switch, said pull-up boost switching stage comprising a transistor having a drain and a gate tied to said node; and
    turning OFF said pull-up boost switching stage before turning OFF said first pull-up switch.

14. The method of claim 13, wherein receiving said low voltage input comprises receiving a voltage input of less than or substantially equal to approximately 1.0 V.

15. The method of claim 13, wherein said pull-up boost switching stage is implemented using a plurality of transistors.

16. The method of claim 15, wherein turning OFF said pull-up boost switching stage comprises turning OFF one of said plurality of transistors.

17. The method of claim 13, wherein said pull-up boost switching stage is implemented using a plurality of PMOS devices.

18. The method of claim 13, further comprising:
    turning ON a second pull-up boost switching stage coupled to a node between said second pull-down switch and a second pull-up switch by turning ON said first pull-down switch; and
    turning OFF said second pull-up boost switching stage before turning OFF said second pull-up switch.

* * * * *